(12) United States Patent
Chung

(10) Patent No.: US 11,488,649 B2
(45) Date of Patent: Nov. 1, 2022

(54) MEMORY APPARATUS MITIGATING ROW HAMMER AND SEMICONDUCTOR SYSTEM USING THE SAME

(71) Applicant: SK hynix Inc., Icheon-si (KR)

(72) Inventor: Won Kyung Chung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/224,752

(22) Filed: Apr. 7, 2021

(65) Prior Publication Data

US 2022/0148648 A1 May 12, 2022

(30) Foreign Application Priority Data

Nov. 9, 2020 (KR) .................. 10-2020-0148221

(51) Int. Cl.
*G11C 11/40* (2006.01)
*G11C 11/406* (2006.01)
*G11C 11/4076* (2006.01)
*G11C 11/4093* (2006.01)

(52) U.S. Cl.
CPC .... *G11C 11/40615* (2013.01); *G11C 11/4076* (2013.01); *G11C 11/4093* (2013.01); *G11C 11/40622* (2013.01)

(58) Field of Classification Search
CPC ........ G11C 11/40615; G11C 11/40622; G11C 11/4076; G11C 11/4093
See application file for complete search history.

(56) References Cited

U.S. PATENT DOCUMENTS

| 2014/0177370 A1* | 6/2014 | Halbert ................ G11C 7/1072 365/222 |
| 2019/0333573 A1* | 10/2019 | Shin ................... G11C 11/40622 |
| 2020/0135263 A1* | 4/2020 | Brown ................. G11C 7/1039 |
| 2020/0251158 A1* | 8/2020 | Shore .................... G11C 11/406 |

FOREIGN PATENT DOCUMENTS

| KR | 1020200084599 A | 7/2020 |
| KR | 1020220062843 A | 5/2022 |

* cited by examiner

*Primary Examiner* — Ajay Ojha
(74) *Attorney, Agent, or Firm* — William Park & Associates Ltd.

(57) ABSTRACT

A memory apparatus may include a row hammer control circuit. The row hammer control circuit may generate a plurality of selection control signals by monitoring an interval at which a memory bank of a memory cell array is accessed. The row hammer apparatus may set a threshold value for performing a refresh operation, as one of a plurality of values, based on the plurality of selection control signals.

21 Claims, 11 Drawing Sheets

MEMORY APPARATUS MITIGATING ROW HAMMER AND SEMICONDUCTOR SYSTEM USING THE SAME

CROSS-REFERENCES TO RELATED APPLICATION

The present application claims priority under 35 U.S.C. § 119(a) to Korean application number 10-2020-0148221, filed on Nov. 9, 2020, in the Korean Intellectual Property Office, which is incorporated herein by reference in its entirety.

BACKGROUND

1. Technical Field

Various embodiments generally illustrate an integrated circuit technology, and more particularly, describe a memory apparatus and a semiconductor system using the same.

2. Related Art

In some embodiments electronic apparatuses may include a large number of electronic components. Among the electronic apparatuses, a computer system may include a large number of semiconductor apparatuses which include a plurality of semiconductors. The computer system includes semiconductor apparatuses which may communicate with one another by transmitting or receiving a clock and data. The semiconductor apparatuses are synchronized with a clock signal and a strobe signal. The data strobe signal may be a clock signal which toggles in synchronization with a timing at which data is transmitted. Thus, in order for the semiconductor apparatuses to accurately transmit and/or receive data, it is important to match the timings of the data and the data strobe signal. However, a skew may occur in the timings of the data and the data strobe signal due to various internal factors of the semiconductor apparatuses.

SUMMARY

In an embodiment, a memory apparatus may include an active monitoring circuit and a mode register circuit. The active monitoring circuit may generate a plurality of selection control signals by monitoring an interval at which a memory bank of a memory cell array is accessed. The mode register circuit may set a threshold value for performing a refresh operation, as one of a plurality of values, based on the plurality of selection control signals.

In an embodiment, a memory apparatus may include a first memory bank, a second memory bank, and a row hammer control circuit. The row hammer control circuit may set a first threshold value as a reference for refreshing the first memory bank, and may monitor an active interval at which the first memory bank is accessed and configured to set a second threshold value as a reference for refreshing the second memory bank, by tracking access of an active interval of the second memory bank.

In an embodiment, a semiconductor system may include a memory apparatus and a memory controller, wherein the memory apparatus may use an active command signal to track an active interval and may change a threshold value based on the active interval. The active command signal is then generated by the memory controller and is used to access the memory apparatus by generating the active command signal and configured to generate a refresh command signal for refreshing the memory apparatus, by comparing an accumulated counting value, obtained by counting the number of generations of the active command signal, with the threshold value.

In an embodiment, a semiconductor system may include a memory apparatus and a memory controller. A memory bank is located in the memory apparatus. Refreshing is accomplished by using the memory controller to generate a refresh command signal based on the number of generations of an active command signal for the memory bank and a generation interval of the active command signal. The memory apparatus may perform a refresh operation for the memory bank, based on the refresh command signal.

In an embodiment, a memory apparatus may include an active monitoring circuit and a mode register circuit. The active monitoring circuit may generate a plurality of selection control signals by monitoring an interval at which a memory bank of a memory cell array is accessed. The mode register circuit may implement a request/threshold value for performing a minimized number of refresh operations based on the request/threshold value and the plurality of selection control signals.

DETAILED DESCRIPTION

Hereinafter, a memory apparatus that is configured to mitigate a row hammer and a semiconductor system including the same will be described below with reference to the accompanying drawings through various examples of embodiments.

Figure 1:
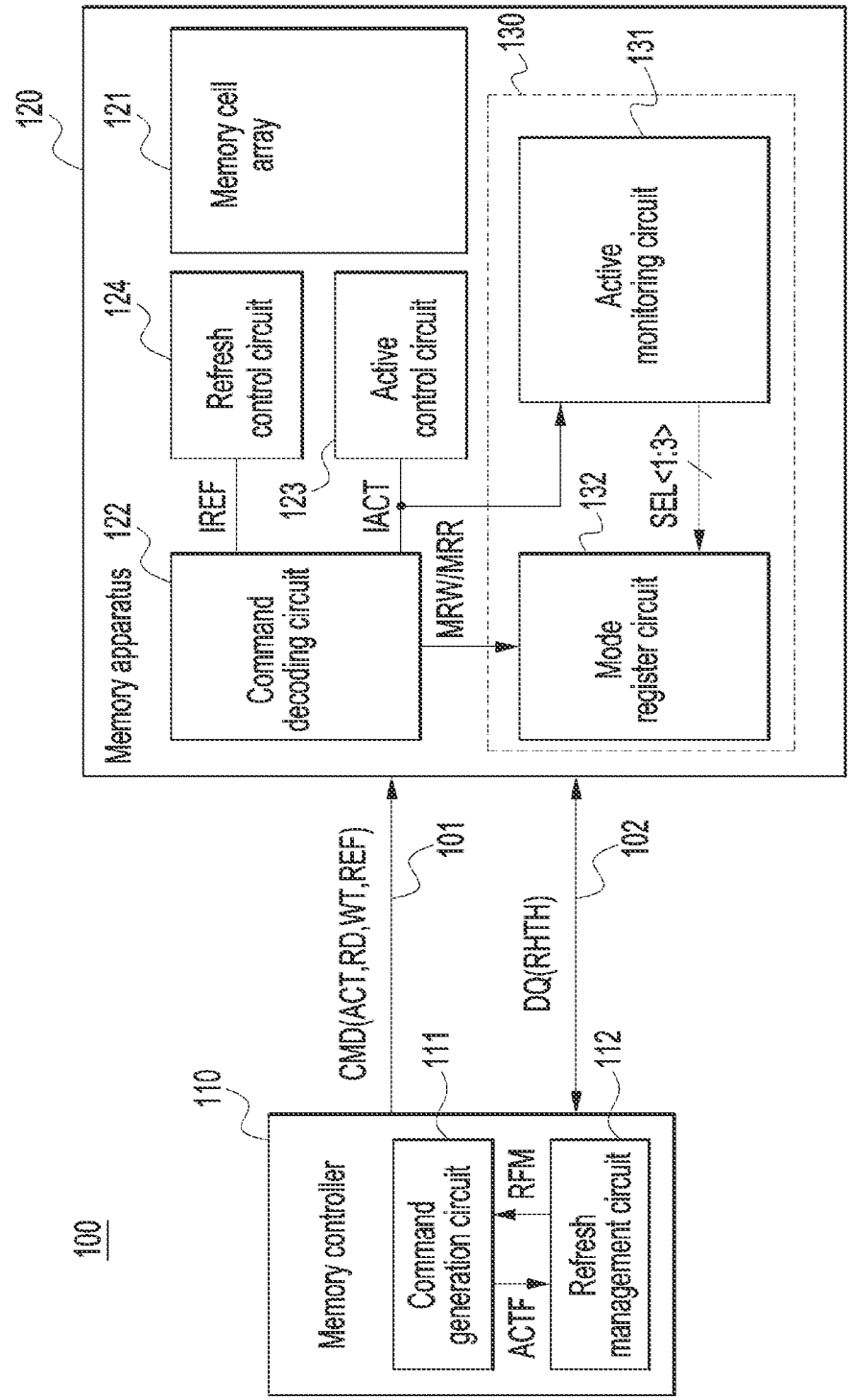
FIG. 1 is a block diagram illustrating the configuration of a semiconductor system in accordance with an embodiment of the disclosure.

FIG. 1 is a block diagram illustrating the configuration of a semiconductor system 100 in accordance with an embodiment of the disclosure. Referring to FIG. 1, the semiconductor system 100 may include a memory controller 110 and a memory apparatus 120, wherein the memory controller 110 may provide various control signals to operate the memory apparatus 120. The memory controller 110 may be built in various types of host devices such as a central processing unit (CPU), a graphic processing unit (GPU), a multimedia processor (MMP), a digital signal processor and an application processor (AP). As illustrated in FIG. 1, in an embodiment, a single package may be obtained by stacking the memory controller 110 together with the memory apparatus 120 on one substrate. The memory apparatus 120 may include all types of memories which perform a refresh operation to retain data stored in memory cells. For example, the memory apparatus 120 may include a dynamic random access memory (DRAM) which is a volatile memory apparatus.

A plurality of buses are used to join the memory controller 110 and the memory apparatus 120, wherein the plurality of buses may be signal transmission paths, links or channels for transmitting signals. The plurality of buses may include a command address bus 101 and a data bus 102. The command address bus 101, generally a unidirectional bus, is used to communicate a command signal CMD and an address signal to the memory apparatus 120. The data bus 102, generally a bidirectional bus, is used to communicate data DQ to the memory apparatus 120. More specifically, the memory controller 110 may transmit a command signal CMD and an address signal to the memory apparatus 120 through the command address bus 101. In an embodiment, for example, the command address bus 101 may be dividedly disposed as a command bus and an address bus. The memory controller 110 may be coupled to the memory apparatus 120 through the data bus 102, and may receive data DQ from the memory apparatus 120 or transmit data DQ to the memory apparatus 120, through the data bus 102. Although not illustrated, the plurality of buses may further include a clock bus, wherein the clock bus may be a unidirectional bus, and the memory controller 110 may transmit a system clock signal to the memory apparatus 120 through the clock bus. Accordingly, the memory controller 110 and the memory apparatus 120 may perform data communication in synchronization with the system clock signal.

As described above, the memory controller 110 may control the operation of the memory apparatus 120 by providing various command signals CMD through the command address bus 101. As illustrated in FIG. 1, the memory controller 110 may generate an active command signal ACT, a read command signal RD and a write command signal WT to access the memory apparatus 120, and may provide the active command signal ACT, the read command signal RD and the write command signal WT to the memory apparatus 120. The active command signal ACT is used by the memory apparatus 120 to realize the active operation, and may enable a word line of a memory cell array 121 of the memory apparatus 120 based on an address signal received together with the active command signal ACT. The memory apparatus 120 may perform a read operation based on the read command signal RD, and may select a bit line of the memory cell array 121 based on an address signal received together with the read command signal RD. A read operation is performed by the memory apparatus 120 for data located in a memory cell between the enabled word line and the selected bit line. The data bus 102 is used to transmit read data sent to the memory controller 110. The memory apparatus 120 may perform a write operation based on the write command signal WT, and may select a bit line of the memory cell array 121 based on an address signal received together with the write command signal WT. The memory apparatus 120 may receive data DQ, transmitted from the memory controller 110, through the data bus 102 during the write operation, and may store the received data in a memory cell which is coupled between the enabled word line and the selected bit line. Where selected, when the read and write operations are completed, the memory apparatus 120 may end the active operation, and may disable the enabled word line.

As illustrated in FIG. 1, the memory controller 110 may further generate a refresh command signal REF for refreshing the memory apparatus 120, and may further provide the refresh command signal REF to the memory apparatus 120. Periodic and aperiodic refresh command signals are used in the present disclosure to track signal changes that are related to changes in data signals. The refresh command signal REF may include a periodic refresh command signal and an aperiodic refresh command signal. The periodic refresh command signal may be periodically generated at constant time intervals by the memory controller 110 for data retention of the memory apparatus 120, and may be provided to the memory apparatus 120. The memory controller 110 may include a dock counter, and may generate the periodic refresh command signal each time a predetermined time elapses, based on a value of the clock counter. The memory apparatus 120 may perform a refresh operation based on the periodic refresh command signal. More specifically, the memory apparatus 120 may perform the refresh operation by sequentially enabling word lines included in the memory cell array 121. The memory controller 110 may generate the aperiodic refresh command signal by detecting a row hammer situation, wherein the row hammer may mean a state in which, when a specific word line is continuously accessed, data stored in a memory cell coupled to a word line adjacent to the accessed word line may be lost. In the present disclosure, the memory controller 110 may compare the number of accesses to a specific memory bank of the memory cell array 121 of the memory apparatus 120 with a threshold value RHTH, and may generate the aperiodic refresh command signal when the number of accesses is the threshold value RHTH to minimize the effects of lost data. Accordingly, the number of accesses to the specific memory bank may be the number of times the active command signal ACT is generated for the specific memory bank. More specifically, the threshold value RHTH, as a value that serves as a reference for performing a refresh operation of the memory apparatus 120, may serve as a reference for determining a possibility that a row hammer will occur in the memory bank of the memory cell array 121 and responding by performing a refresh operation when a row hammer is likely to occur.

As illustrated in FIG. 1, the memory controller 110 may include a command generation circuit 111 and a refresh management circuit 112. Accordingly, the command generation circuit 111 may generate the command signal CMD capable of instructing various operations of the memory apparatus 120. The memory controller 110 may generate the command signal CMD by receiving a read request and a write request from a host device, wherein the memory controller 110 may generate at least one of the active command signal ACT and the read command signal RD based on the read request, and may generate at least one of the active command signal ACT and the write command signal WT based on the write request. In accordance with the present disclosure, command generation circuit 111 may adjust the order of the command signal CMD generated according to a request, by scheduling a command generation sequence, and may periodically generate the refresh command signal REF as the periodic refresh command signal each time a constant time elapses. More specifically, when the generation of the periodic refresh command signal is required, the command generation circuit 111 may defer the generation of the active command signal ACT, the read command signal RD and the write command signal WT by a request received in advance. Subsequently, when a refresh operation of the memory apparatus 120 is completed according to the refresh command signal REF, the command generation circuit 111 may generate the deferred active command signal ACT, the deferred read command signal RD or the deferred write command signal WT. The command generation circuit 111 may generate the refresh command signal REF as the aperiodic refresh command signal by receiving a refresh management signal RFM. The refresh management signal RFM may be generated from the refresh management circuit 112. According to the present disclosure, the refresh management signal RFM may be a signal which is generated from the refresh management circuit 112 to determine that a row hammer situation has occurred in the memory apparatus 120 and instruct the memory apparatus 120 to perform a refresh operation. When generating the active command signal ACT for a specific memory bank of the memory cell array 121, the command generation circuit 111 may output an active counting signal ACTF to the refresh management circuit 112. Specifically, each time the active command signal ACT for the specific memory bank is generated, the command generation circuit 111 may output the active counting signal ACTF to the refresh management circuit 112.

The refresh management circuit 112 may store the threshold value RHTH, and may compare the number of accesses to the specific memory bank with the threshold value RHTH. Accordingly, in order to detect the number of accesses to the specific memory bank, the refresh management circuit 112 may store an accumulated counting value by counting the number of times the active command signal ACT for the specific memory bank is generated. As will be described later, the threshold value RHTH may be transmitted from the memory apparatus 120. Subsequently, the refresh management circuit 112 may receive the active counting signal ACTF from the command generation circuit 111, and may generate the accumulated counting value by counting the number of generations of the active counting signal ACTF. The refresh management circuit 112 may generate the refresh management signal RFM by comparing the number of generations of the active command signal ACT for the specific memory bank of the memory cell array 121 of the memory apparatus 120 with the threshold value RHTH. According to the present disclosure, when the refresh management circuit 112 determines that a row hammer situation has occurred, i.e., when the number of generations of the active command signal ACT is equal to or greater than the threshold value RHTH, the refresh management circuit 112 may enable the refresh management signal RFM. When the refresh command signal REF is generated from the command generation circuit 111, the refresh management circuit 112 may subtract the threshold value RHTH from the accumulated counting value.

As illustrated in FIG. 1, the memory apparatus 120 may include the memory cell array 121 that has at least one memory bank, a command decoding circuit 122, an active control circuit 123, a refresh control circuit 124 and a row hammer control circuit 130. Although not illustrated, a plurality of word lines and a plurality of bit lines may be disposed in the memory bank, and a plurality of memory cells may be coupled to points where the plurality of word lines and the plurality of bit lines intersect. The command decoding circuit 122 may be coupled to the command address bus 101, and may receive the command signal CMD from the memory controller 110. The command decoding circuit 122 may generate an internal command signal by decoding the command signal CMD. The command decoding circuit 122 may generate and internal active signal IACT by decoding the command signal CMD in which the active command signal ACT is included. The command decoding circuit 122 may generate an internal refresh signal IREF by decoding the refresh command signal REF including one of the periodic refresh command signals and the aperiodic refresh command signal.

As illustrated in FIG. 1, the active control circuit 123 may receive the internal active signal IACT from the command decoding circuit 122, wherein the active control circuit 123 may control an active operation of the memory cell array 121 based on the internal active signal IACT. The active control circuit 123 may activate the memory bank based on the internal active signal IACT. The active control circuit 123 may enable a specific word line of the memory bank based on an address signal received together with the active command signal ACT. The refresh control circuit 124 may receive the internal refresh signal TREF from the command decoding circuit 122 and may control a refresh operation of the memory cell array 121 based on the internal refresh signal IREF. The refresh control circuit 124 may activate the memory bank, and may sequentially enable the plurality of word lines of the memory bank. The refresh control circuit 124 may include an address counter (not shown), and may sequentially change a word line to be enabled, while sequentially increasing a value of an address signal.

The row hammer control circuit 130 may monitor an interval at which the memory bank of the memory cell array 121 is accessed. In addition, the row hammer control circuit 130 may monitor an active interval at which the memory bank of the memory cell array 121 is activated and may monitor the active interval based on the active command signal ACT. When the active interval is an interval at which at least two active command signals ACT are generated, for example, the active interval may be a time from a time point at which the internal active signal IACT is generated based on a previously received active command signal ACT to a time point at which the internal active signal IACT is generated based on a currently received active command signal ACT. When the row hammer control circuit 130 receives the internal active signal IACT from the command decoding circuit 122, the row hammer control circuit 130 may track the active interval based on the internal active signal IACT. Subsequently, the row hammer control circuit 130 may change the threshold value RHTH based on the active interval. The row hammer control circuit 130 may change the threshold value RHTH to a smaller value as the active interval is shorter, and may change the threshold value RHTH to a larger value as the active interval is longer. Accordingly, in some embodiments, a general memory controller may determine a row hammer situation when the active command signal ACT for a specific memory bank is generated by a fixed threshold value, and may generate the refresh command signal REF. However, if an active interval becomes shorter, a row hammer situation may occur even though the number of times the active command signal ACT is generated is less than the fixed threshold value. Therefore, even though the refresh command signal REF is generated after the active command signal ACT is generated by the fixed threshold value, for example, there is a high possibility that data stored in the memory bank will be lost. Conversely, if the active interval becomes longer, a row hammer situation may occur after the number of accesses becomes greater than the fixed threshold value. Although, as noted above, a frequency of refreshing may be calculated based on threshold values, a request may also be used to change the frequency of refreshing. However, if the refresh command signal REF is generated based on the fixed threshold value, a memory controller needs to defer the generation of another command signal by a request. As a consequence, the performance of a semiconductor system may be degraded, and power consumption may increase as a memory apparatus frequently performs a refresh operation. However, an advantage of the present disclosure is that the row hammer control circuit 130 may flexibly adjust the threshold value RHTH based on the active interval, thereby mitigating a row hammer and optimizing the performance of the semiconductor system 100.

As illustrated in FIG. 1, the row hammer control circuit 130 may include an active monitoring circuit 131 and a mode register circuit 132. The active monitoring circuit 131 may generate a plurality of selection control signals SEL<1:3> by monitoring an interval at which the memory bank of the memory cell array 121 is accessed. The active monitoring circuit 131 may receive the internal active signal IACT, and may generate the plurality of selection control signals SEL<1:3> based on an interval at which the internal active signal IACT is generated. In addition, the active monitoring circuit 131 may generate the plurality of selection control signals SEL<1:3> by determining a time corresponding to the interval at which the memory bank is accessed. The plurality of selection control signals SEL<1:3> may include a first selection control signal SEL<1>, a second selection control signal SEL<2> and a third selection control signal SEL<3>, but are not limited thereto. In particular, in an embodiment, in order to more finely adjust the threshold value RHTH, the number of the plurality of selection control signals may be more than three. Hence, although the active monitoring circuit 131 may enable one of the first to third selection control signals SEL<1:3> by comparing the interval at which the memory bank is accessed (i.e., the active interval), with first and second times, as is illustrated in FIG. 1, but the number of selection control signals is not limited thereto. The active monitoring circuit 131 may enable the first selection control signal SEL<1> when the active interval is shorter than a reference time range, may enable the second selection control signal SEL<2> when the active interval is within the reference time range, and may enable the third selection control signal SEL<3> when the active interval is longer than the reference time range.

As illustrated in FIG. 1, the mode register circuit 132 may receive the plurality of selection control signals SEL<1:3> from the active monitoring circuit 131. The mode register circuit 132 may set the threshold value RHTH to one of a plurality of values based on the plurality of selection control signals SEL<1:3>. The plurality of values may include a first value, a second value and a third value. The second value may be greater than the first value, and the third value may be greater than the second value. The first to third values may be provided from the memory controller 110. However, in an embodiment, the mode register circuit 132 may receive only the second value from the memory controller 110, and may generate the first value and the third value by adding or subtracting a predetermined value to or from the second value. Thus, the number of selection control signals is flexible and may be adapted to a user's convenience. The memory controller 110 may further generate a mode register write command signal, and the command decoding circuit 122 may generate a mode register write signal MRW by decoding the mode register write command signal. The mode register circuit 132 may perform a mode register write operation based on the mode register write signal MRW. In accordance with selection control signals selected, the first to third values or the second value may be transmitted from the memory controller 110 together with the mode register write command signal, and the mode register circuit 132 may store the first to third values during the mode register write operation. The mode register circuit 132 may set the first value as the threshold value RHTH when the first selection control signal SEL<1> is enabled and may set the second value as the threshold value RHTH when the second selection control signal SEL<2> is enabled. The mode register circuit 132 may set the third value as the threshold value RHTH when the third selection control signal SEL<3> is enabled. The memory controller 110 may further generate a mode register read command signal, and the command decoding circuit 122 may generate a mode register read signal MRR by decoding the mode register read command signal. Subsequently, the mode register circuit 132 may perform a mode register read operation based on the mode register read signal MRR. In one embodiment, the mode register circuit 132 may transmit the threshold value RHTH, set to one of the first to third values, to the memory controller 110 during the mode register read operation. The threshold value RHTH may be transmitted to the memory controller 110 through, for example, the data bus 102.

Figure 2:
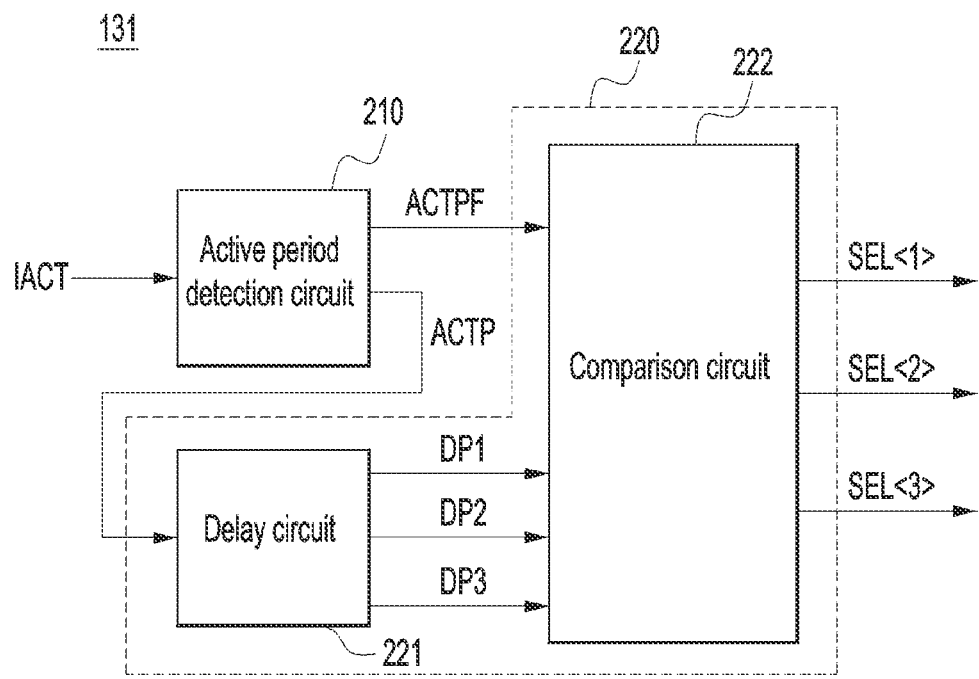
FIG. 2 is a block diagram illustrating an example of the configuration of an active monitoring circuit illustrated in FIG. 1.

FIG. 2 is a diagram illustrating the configuration of the active monitoring circuit 131 illustrated in FIG. 1, Referring to FIG. 2, the active monitoring circuit 131 may include an active period detection circuit 210 and a pulse width detection circuit 220. In one embodiment, the active period detection circuit 210 may generate an active pulse signal ACTP which has a pulse width corresponding to an interval between at least two internal active signals IACT. The active period detection circuit 210 may receive the internal active signal IACT, and may generate the active pulse signal ACTP based on the internal active signal IACT. Subsequently, the active period detection circuit 210 may generate the active pulse signal ACTP which is enabled at a time point when the internal active signal IACT is enabled for the first time and is disabled at a time point when the internal active signal IACT is enabled for the second time. Therefore, according to the present disclosure, the active period detection circuit 210 may generate the active pulse signal ACTP which is enabled for a time corresponding to the active interval. The active period detection circuit 210 may generate a timing pulse signal ACTPF when the active pulse signal ACTP is disabled. The timing pulse signal ACTPF may be a short pulse signal which is generated immediately after the active pulse signal ACTP is disabled.

As illustrated in FIG. 2, the pulse width detection circuit 220 may receive the active pulse signal ACTP from the active period detection circuit 210. In one embodiment, the pulse width detection circuit 220 may enable one of the first to third selection control signals SEL<1:3> by detecting a pulse width of the active pulse signal ACTP. The pulse width detection circuit 220 may enable the first selection control signal SEL<1> when the active pulse signal ACTP is enabled for a time shorter than the first time. The pulse width detection circuit 220 may enable the second selection control signal SEL<2> when the active pulse signal ACTP is enabled for a time longer than the first time and shorter than the second time. The reference time range may be between the first time and the second time. The pulse width detection circuit 220 may enable the third selection control signal SEL<3> when the active pulse signal ACTP is enabled for a time longer than the second time and shorter than a third time.

Figure 4:
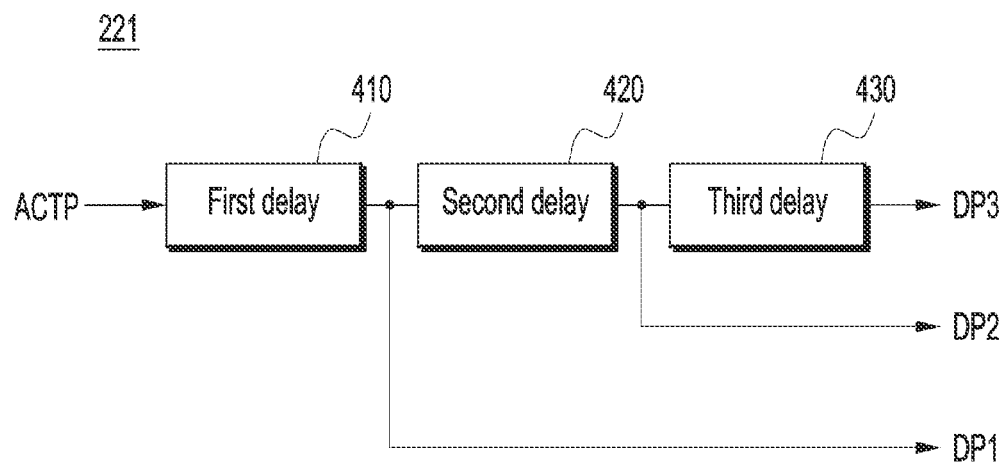
FIG. 4 is a block diagram illustrating an example of the configuration of a delay circuit illustrated in FIG. 2.

As illustrated in FIG. 4, the pulse width detection circuit 220 may include a delay circuit 221 and a comparison circuit 222. The delay circuit 221 may receive the active pulse signal ACTP, and may generate a first delayed pulse signal DP1, a second delayed pulse signal DP2 and a third delayed pulse signal DP3 by delaying the active pulse signal ACTP. The delay circuit 221 may generate the first delayed pulse signal DP1 by delaying the active pulse signal ACTP by the first time. The delay circuit 221 may generate the second delayed pulse signal DP2 by delaying the active pulse signal ACTP by the second time. The delay circuit 221 may generate the third delayed pulse signal DP3 by delaying the active pulse signal ACTP by the third time. The second time may be two times the first time, and the third time may be three times the first time.

The comparison circuit 222 may enable one of the first to third selection control signals SEL<1:3> by comparing a time point at which the active pulse signal ACTP is disabled and each of time points at which the first to third delayed pulse signals DP1, DP2 and DP3 are enabled. Subsequently, the comparison circuit 222 may receive the timing pulse signal ACTP from the active period detection circuit 210, and may receive the first delayed pulse signal DP1, the second delayed pulse signal DP2 and the third delayed pulse signal DP3 from the delay circuit 221. The comparison circuit 222 may generate the first to third selection control signals SEL<1:3> by determining enable states of the first to third delayed pulse signals DP1, DP2 and DP3 at a time point at which the timing pulse signal ACTPF is enabled. When the timing pulse signal ACTPF is enabled, the comparison circuit 222 may enable the first selection control signal SEL<1> if the first delayed pulse signal DP1 is in a disabled state, and may maintain the first selection control signal SEL<1> in a disabled state if the first delayed pulse signal DP1 is in an enabled state. When the timing pulse signal ACTPF is enabled, the comparison circuit 222 may enable the second selection control signal SEL<2> if the second delayed pulse signal DP2 is in a disabled state, and may maintain the second selection control signal SEL<2> in a disabled state if the second delayed pulse signal DP2 is in an enabled state. When the timing puke signal ACTPF is enabled, the comparison circuit 222 may enable the third selection control signal SEL<3> if the third delayed puke signal DP3 is in a disabled state, and may maintain the third selection control signal SEL<3> in a disabled state if the third delayed puke signal DP3 is in an enabled state.

Figure 3:
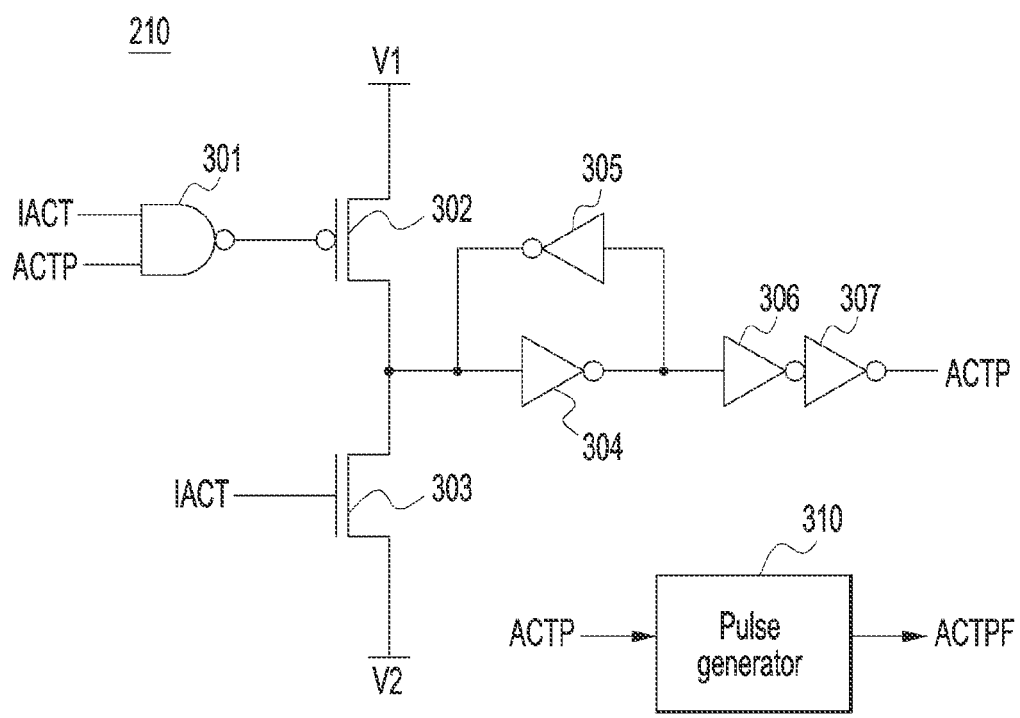
FIG. 3 is a diagram illustrating an example of the configuration of an active period detection circuit illustrated in FIG. 2.

FIG. 3 is a diagram illustrating the configuration of the active period detection circuit 210 illustrated in FIG. 2. Referring to FIG. 3, the active period detection circuit 210 may include a NAND gate 301, a first transistor 302, a second transistor 303, a first inverter 304, a second inverter 305, a third inverter 306, a fourth inverter 307 and a puke generator 310. The NAND gate 301 may receive the internal active signal IACT and the active pulse signal ACTP. The first transistor 302 may be a P-channel MOS transistor. A source of the first transistor 302 may receive a first voltage V1, and a gate of the first transistor 302 may receive a signal outputted from the NAND gate 301. The second transistor 303 may be an N-channel MOS transistor, wherein a drain of the second transistor 303 may be coupled to a drain of the first transistor 302, and a source of the second transistor 303 may receive a second voltage V2. A gate of the second transistor 303 may receive the internal active signal IACT. The second voltage V2 may have a voltage level lower than the first voltage V1, wherein the first voltage V1 may have a sufficiently high voltage level to be determined as a logic high level, and the second voltage V2 may have a sufficiently low voltage level to be determined as a logic low level. The size or current drivability of the second transistor 303 may be smaller than the size or current drivability of the first transistor 302. The first inverter 304 may be coupled in common to the drains of the first and second transistors 302 and 303 and invert and drive signals outputted from the drains of the first and second transistors 302 and 303. The second inverter 305 may form a latch with the first inverter 304 and maintain a logic level of a signal outputted from the first inverter 304 and the third and fourth inverters 306 and 307 may be sequentially coupled in series and function as a non-inverting buffer. The third and fourth inverters 306 and 307 may sequentially invert and drive the signal outputted from the first inverter 304 and output the active pulse signal ACTP. As illustrated in FIG. 3, the pulse generator 310 may receive the active pulse signal ACTP and generate the timing pulse signal ACTPF. The pulse generator 310 may generate the timing pulse signal ACTPF having a short pulse width, when the active pulse signal ACTP is disabled after maintaining an enabled state. The active pulse signal ACTP may be initially in a state in which it is disabled to a logic low level. When the internal active signal IACT is enabled for the first time, the signal outputted from the NAND gate 301 may maintain a logic high level, and the first transistor 302 may maintain a turned-off state. The second transistor 303 may be turned on based on the internal active signal IACT, and may output the second voltage V2 through the drain. Accordingly, a signal having a logic low level may be sequentially inverted and driven through the first inverter 304, the third inverter 306 and the fourth inverter 307, and the active pulse signal ACTP may be enabled to a logic high level. The first and second inverters 304 and 305 may maintain the enabled state of the active pulse signal ACTP. Accordingly, when the internal active signal IACT is enabled for the second time, the output signal of the NAND gate 301 may transition to a logic low level. The first transistor 302 may be turned on and output the first voltage V1 through the drain thereof. In the present disclosure, since the first transistor 302 has a size larger than the second transistor 303, a signal inputted to the first inverter 304 may have a logic high level even though the second voltage V2 is provided to the drain of the second transistor 303 based on the internal active signal IACT. The first, third and fourth inverters 304, 306 and 307 may sequentially invert and drive the signal having a logic high level, and the active puke signal ACTP may be disabled to a logic low level. Hence, if the active puke signal ACTP is disabled to a logic low level, the pulse generator 310 may generate the timing pulse signal ACTPF.

Figure 5:
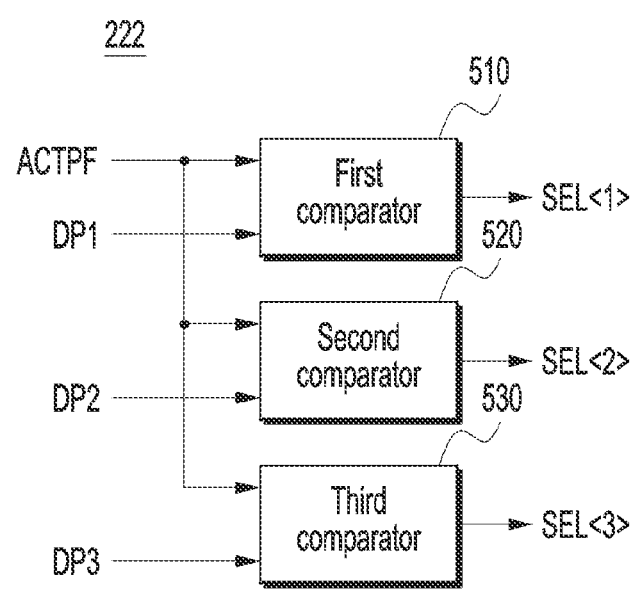
FIG. 5 is a block diagram illustrating an example of the configuration of a comparison circuit illustrated in FIG. 2.

FIG. 4 is a diagram illustrating the configuration of the delay circuit 221 illustrated in FIG. 2. Referring to FIGS. 4-5, the delay circuit 221 may include a first delay 410, a second delay 420 and a third delay 430. Selection control signals SEL<1> through SEL<3> may be adjusted using the first delay unit 410, the second delay unit 420 and the third delay unit 430. The first to third delays 410, 420 and 430 may have the same delay amount, and the delay amount of each of the first to third delays 410, 420 and 430 may correspond to the first time. In an embodiment, for example, the delay amounts of the first to third delays 410, 420 and 430 may be different from each other. Two delays may have the same delay amount, and the other delay may have a different delay amount. The first delay 410 may receive the active pulse signal ACTP, and may output the first delayed pulse signal DP1 by delaying the active pulse signal ACTP by the first time. The first delayed pulse signal DP1 may be enabled at a time point later by the first time than the active pulse signal ACTP. The second delay 420 may receive the first delayed pulse signal DP1 from the first delay 410, and may output the second delayed pulse signal DP2 by delaying the first delayed pulse signal DP1 by the first time. The second delayed pulse signal DP2 may be enabled at a time point later by the second time than the active pulse signal ACTP. The third delay 430 may receive the second delayed pulse signal DP2 from the second delay 420, and may output the third delayed pulse signal DP3 by delaying the second delayed pulse signal DP2 by the first time. The third delayed pulse signal DP3 may be enabled at a time point later by the third time than the active pulse signal ACTP.

FIG. 5 is a diagram illustrating the configuration of the comparison circuit 222 illustrated in FIG. 2. Referring to FIG. 5, the comparison circuit 222 may include a first comparator 510, a second comparator 520 and a third comparator 530. The first comparator 510 may receive the timing pulse signal ACTPF and the first delayed pulse signal DP1. In one embodiment, the first comparator 510 may generate the first selection control signal SEL<1> by comparing an enable time point of the timing pulse signal ACTPF and an enable time point of the first delayed pulse signal DP1. Next, the first comparator 510 may enable the first selection control signal SEL<1> when the timing pulse signal ACTPF is enabled earlier than a time point at which the first delayed pulse signal DP1 is enabled. The second comparator 520 may receive the timing pulse signal ACTPF and the second delayed pulse signal DP2. In addition, the second comparator 520 may generate the second selection control signal SEL<2> by comparing an enable time point of the timing pulse signal ACTPF and an enable time point of the second delayed pulse signal DP2. The second comparator 520 may enable the second selection control signal SEL<2> when the timing pulse signal ACTPF is enabled earlier than a time point at which the second delayed pulse signal DP2 is enabled. Subsequently, the third comparator 530 may receive the timing pulse signal ACTPF and the third delayed pulse signal DP1 The third comparator 530 may generate the third selection control signal SEL<3> by comparing a disable time point of the timing pulse signal ACTPF and an enable time point of the third delayed pulse signal DP3. The third comparator 530 may enable the third selection control signal SEL<3> when the timing pulse signal ACTPF is disabled earlier than a time point at which the third delayed pulse signal DP3 is enabled.

Figure 6:
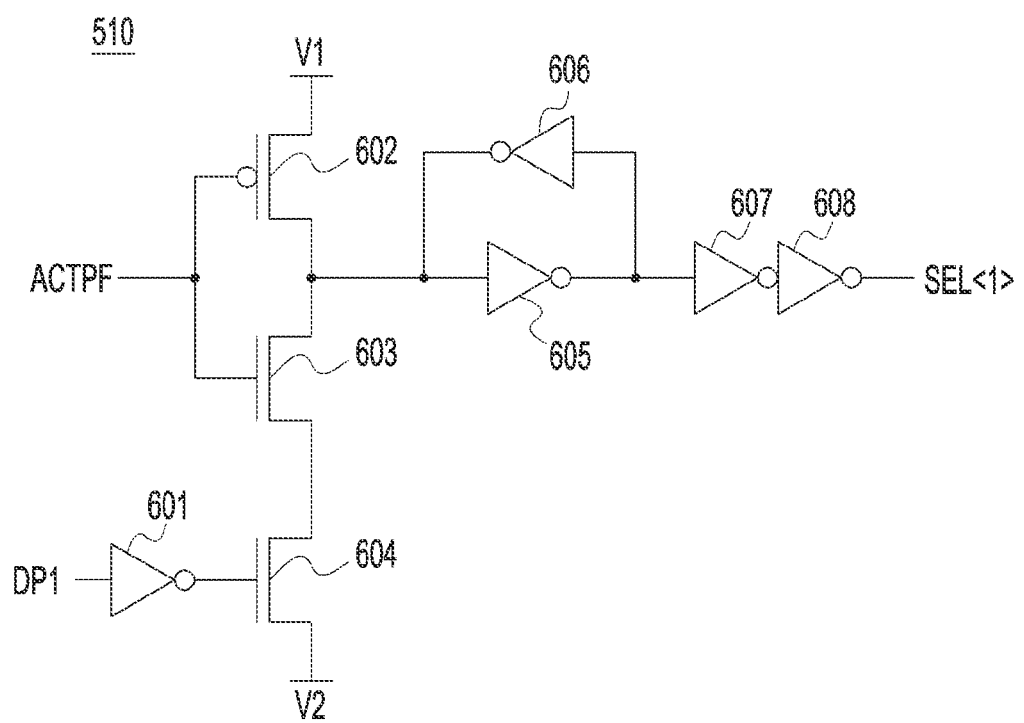
FIG. 6 is a diagram illustrating an example of the configuration of a first comparator illustrated in FIG. 5.

FIG. 6 is a diagram illustrating the configuration of the first comparator 510 illustrated in FIG. 5. Referring to FIG. 6, the first comparator 510 may include a first inverter 601, a first transistor 602, a second transistor 603, a third transistor 604, a second inverter 605, a third inverter 606, a fourth inverter 607 and a fifth inverter 608. In one embodiment, the first inverter 601 may invert and drive the first delayed pulse signal DP1. For example, the first transistor 602 may be a P-channel MOS transistor. Accordingly, a source of the first transistor 602 may receive the first voltage V1, and a gate of the first transistor 602 may receive the timing pulse signal ACTPF. The second transistor 603 may be an N-channel MOS transistor. A drain of the second transistor 603 may be coupled to a drain of the first transistor 602, and a gate of the second transistor 603 may receive the timing pulse signal ACTPF. For example, the third transistor 604 may be an N-channel MOS transistor. Subsequently, a drain of the third transistor 604 may be coupled to a source of the second transistor 603, and a source of the third transistor 604 may receive the second voltage V2. Then a gate of the third transistor 604 may receive an output signal of the first inverter 601. The second inverter 605 may be coupled in common to the drains of the first and second transistors 602 and 603 and invert and drive signals outputted from the drains of the first and second transistors 602 and 603. The third inverter 606 may form a latch with the second inverter 605. The fourth inverter 607 and the fifth inverter 608 may sequentially invert and drive an output signal of the second inverter 605 and generate the first selection control signal SEL<1>. Accordingly, when the timing pulse signal ACTPF is in a state in which it is disabled to a logic low level, the first transistor 602 may be turned on and output the first voltage V1 through the drain thereof, and the second, fourth and fifth inverters 605, 607 and 608 may sequentially invert and drive a signal having a logic high level and output the first selection control signal SEL<1> which is disabled to a logic low level. In corresponding fashion, when the timing pulse signal ACTPF is enabled to a logic high level, the first transistor 602 may be turned off and the second transistor 603 may be turned on. When the timing pulse signal ACTPF is enabled, if the first delayed pulse signal DP1 is in a state in which it is disabled to a logic low level, the third transistor 604 may be turned on, and the second voltage V2 may be provided to the drain of the second transistor 603. Accordingly, the first selection control signal SEL<1> which is enabled to a logic high level may be outputted. Conversely, when the timing pulse signal ACTPF is enabled, if the first delayed pulse signal DP1 is in a state in which it is enabled to a logic high level, the third transistor 604 may be turned off, and the second voltage V2 may not be provided to the drain of the second transistor 603. Accordingly, as illustrated in FIG. 6, the first selection control signal SEL<1> may maintain a state in which it is disabled to a logic low level, and the second comparator 520 and the third comparator 530 may have substantially the same configuration and perform substantially the same function as the first comparator 510 except signals inputted thereto and signals outputted therefrom.

Figure 7:
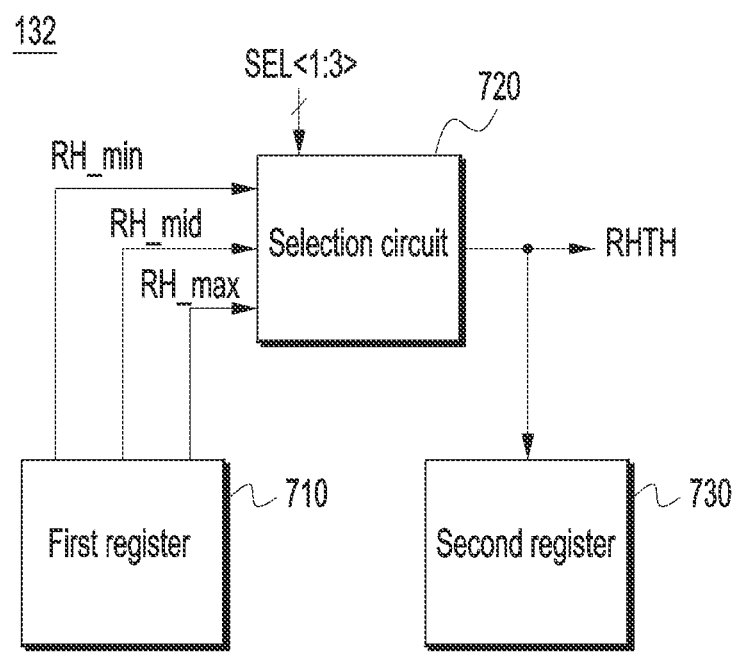
FIG. 7 is a block diagram illustrating an example of the configuration of a mode register circuit illustrated in FIG. 1.

FIG. 7 is a diagram illustrating the configuration of the mode register circuit 132 illustrated in FIG. 1, FIG. 7 may illustrate only some components related with the operation of the embodiment of the disclosure among various components of the mode register circuit 132. Referring to FIG. 7, the mode register circuit 132 may include a first register 710, a selection circuit 720 and a second register 730. Accordingly, the first register 710 may store various information related with the operation of the memory apparatus 120, During a mode register write operation, the first register 710 may store a first value RH_min, a second value RH_mid and a third value RH_max transmitted from the memory controller 110. As illustrated in FIG. 7, the first register 710 may provide the first to third values RH_min, RH_mid and RH_max to the selection circuit 720, and the selection circuit 720 may receive the first to third values RH_min, RH_mid, and RH_max from the first register 710, and may receive the first to third selection control signals SEL<1:3> from the active monitoring circuit 131. The selection circuit 720 may output the first value RH_min as the threshold value RHTH when the first selection control signal SEL<1> is enabled. The selection circuit 720 may output the second value RH_mid as the threshold value RHTH when the second selection control signal SEL<2> is enabled. Subsequently, the selection circuit 720 may output the third value RH_max as the threshold value RHTH when the third selection control signal SEL<3> is enabled. The second register 730 may store the threshold value RHTH outputted from the selection circuit 720. During a mode register read operation, the second register 730 may output the threshold value RHTH to the memory controller 110.

Figure 8:
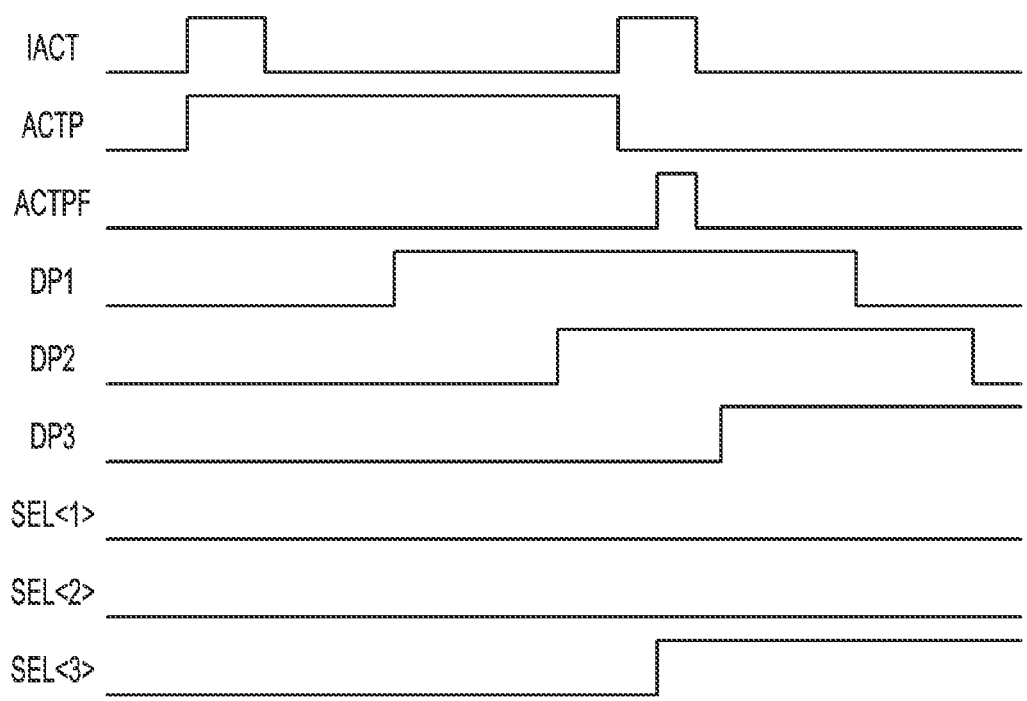
FIG. 8 is a timing diagram to assist in the explanation of the operation of a row hammer control circuit in accordance with the embodiment of the disclosure.

FIG. 8 is a timing diagram to assist in the explanation of the operation of the row hammer control circuit 130 in accordance with the embodiment of the disclosure. Referring to FIGS. 1 to 8, the active monitoring circuit 131 may generate the active pulse signal ACTP based on the internal active signal IACT. In FIG. 8, a case where an active interval is long will be representatively described. When a first internal active signal IACT is enabled, the active period detection circuit 210 may enable the active pulse signal ACTP. When a second internal active signal IACT is enabled, the active period detection circuit 210 may disable the active pulse signal ACTP. Therefore, as shown in FIG. 8, the active period detection circuit 210 may generate the active pulse signal ACTP having a pulse width corresponding to an interval from a time point at which the first internal active signal IACT is generated to a time point at which the second internal active signal IACT is generated. The active period detection circuit 210 may generate the timing pulse signal ACTPF when the active pulse signal ACTP is disabled.

As illustrated in FIG. 2, the delay circuit 221 may receive the active pulse signal ACTP, and may generate the first to third delayed pulse signals DP1, DP2 and DP3 by sequentially delaying the active pulse signal ACTP. When the timing pulse signal ACTPF is enabled, the comparison circuit 222 may enable one of the first to third selection control signals SEL<1:3> depending on the logic levels of the first to third delayed pulse signals DP1, DP2 and DP3. When the timing pulse signal ACTPF is enabled, the first and second delayed pulse signals DP1 and DP2 may maintain logic high levels by being enabled, and the third delayed puke signal DP3 may maintain a disabled state. Accordingly, the comparison circuit 222 may maintain the first and second selection control signals SEL<1:2> in disabled states, and may enable the third selection control signal SEL<3>. When the third selection control signal SEL<3> is enabled, the selection circuit 720 may output the third value RH_max, having a largest value among the first to third values RH_min, RH_mid and RH_max, as the threshold value RHTH, and the second register 730 may store the threshold value RHTH having the third value RH_max. Thus, the threshold value RHTH may be set as the third value RH_max.

Figure 9:
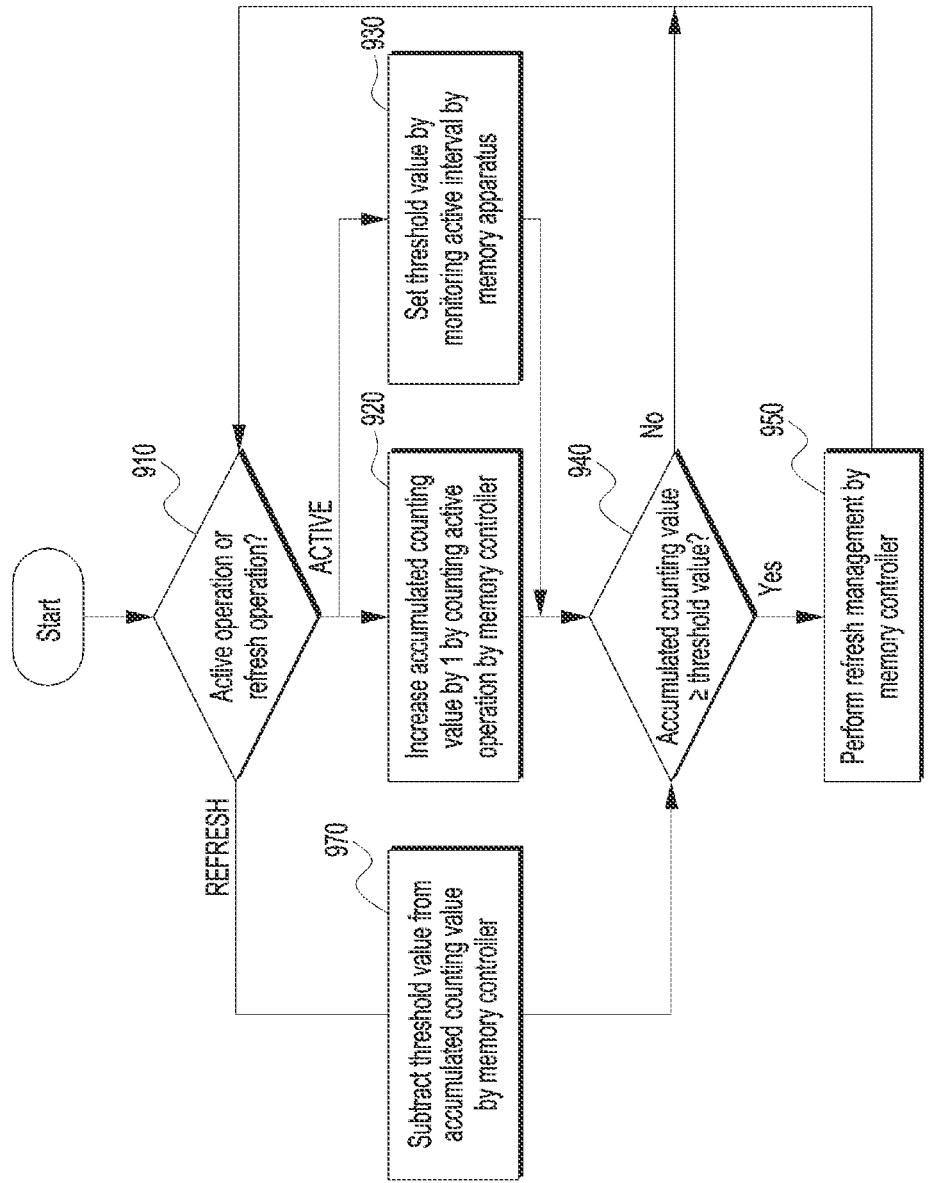
FIG. 9 is a flow chart to assist in the explanation of the operation of the semiconductor system in accordance with the embodiment of the disclosure.

FIG. 9 is a flow chart to assist in the explanation of the operation of the semiconductor system 100 in accordance with the embodiment of the disclosure. The operation of the semiconductor system 100 in accordance with the embodiment of the disclosure will be described below with reference to FIGS. 1 and 9. When the memory controller 110 starts to control the operation of the memory apparatus 120, the memory controller 110 may transmit various command signals to the memory apparatus 120. At 910, the memory controller 110 may determine whether an operation performed by the memory apparatus 120 is an active operation or a refresh operation. Subsequently, the process may proceed to 920 in the case where the memory controller 110 generates the active command signal ACT and the memory apparatus 120 performs an active operation (ACTIVE), and may proceed to 970 when the memory controller 110 generates the refresh command signal REF and the memory apparatus 120 performs a refresh operation (REFRESH), In the case where the active operation is performed, at 920, the memory controller 110 may count the active operation and increase an accumulated counting value by 1. Then, at 930, the memory apparatus 120 may monitor an active interval. In the case where the memory controller 110 transmits the active command signal ACT to the memory apparatus 120 again at 910, the memory controller 110 may increase the accumulated counting value by 1 again at 920, and the memory apparatus 120 may monitor an interval between the first active operation and a second active operation at 930. Subsequently, the memory apparatus 120 may set the threshold value RHTH based on the monitored active interval. The memory controller 110 may receive the threshold value RHTH set by the memory apparatus 120.

Figure 10:
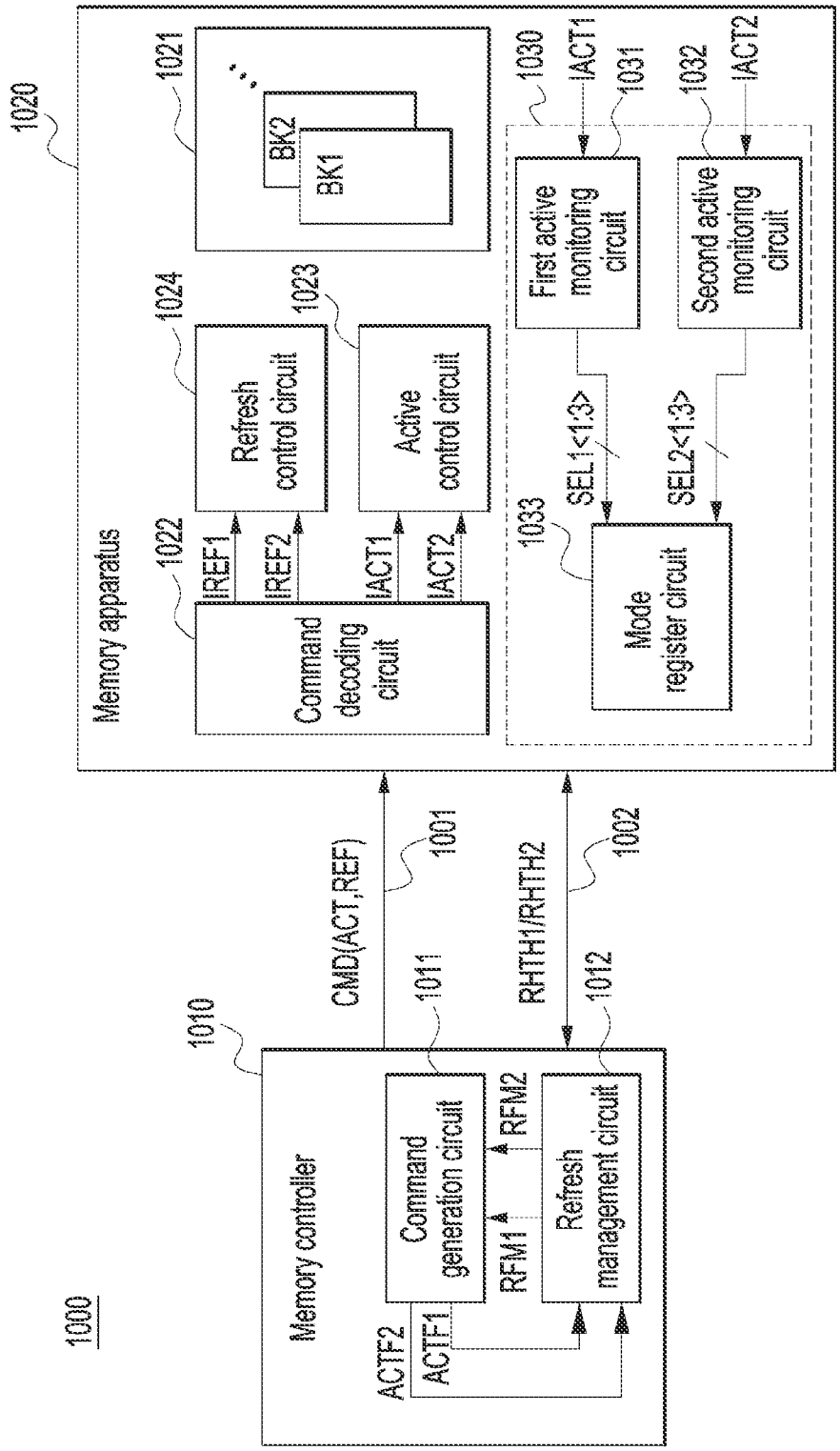
FIG. 10 is a block diagram illustrating an example of the configuration of a semiconductor system in accordance with an embodiment of the disclosure.

Next, at 940, the memory controller 110 may compare the accumulated counting value and the threshold value RHTH. When the accumulated counting value is less than the threshold value RHTH (No), the process may proceed to 910, and the memory controller 110 may transmit the active command signal ACT to the memory apparatus 120 again. More specifically, when the accumulated counting value is greater than the threshold value RHTH (Yes), the process may proceed to 950. At 950, the memory controller 110 may determine that a row hammer situation has occurred, and may perform a refresh management. When the refresh management is performed, the memory controller 110 may generate the refresh command signal REF at 910, and the memory apparatus 120 may perform a refresh operation. When the refresh operation is performed, the memory controller 110 may subtract the threshold value RHTH from the accumulated counting value at 970, and the accumulated counting value to be compared with the threshold value RHTH at 940 may be reduced. FIG. 10 is a diagram illustrating the configuration of a semiconductor system 1000 in accordance with an embodiment of the disclosure. Referring to FIG. 10, the semiconductor system 1000 may include a memory controller 1010 and a memory apparatus 1020. For example, the semiconductor system 1000 may include the same or similar components as or to those of the semiconductor system 100 illustrated in FIG. 1, and repeated descriptions for the same components will be omitted herein. The memory controller 1010 may include a command generation circuit 1011 and a refresh management circuit 1012. As illustrated in FIG. 10, the memory apparatus 1020 may include a memory cell array 1021, a command decoding circuit 1022, an active control circuit 1023, a refresh control circuit 1024 and a row hammer control circuit 1030. The memory cell array 1021 may include a plurality of memory banks. In FIG. 10, a first memory bank BK1 and a second memory bank BK2 are illustrated by way of example, but it is not limited to two memory banks. A memory bank may be a unit cell array of a memory cell array, which may be independently activated. The command decoding circuit 1022 may receive various command signals CMD from the memory controller 1010 through a command address bus 1001. The command decoding circuit 1022 may generate a first internal active signal IACT1 and a second internal active signal IACT2 by decoding an active command signal ACT. For example, the command decoding circuit 1022 may generate the first internal active signal IACT1 for activating the first memory bank BK1 and the second internal active signal IACT2 for activating the second memory bank BK2, based on bank address information received together with the active command signal ACT. The command decoding circuit 1022 may generate a first internal refresh signal IREF1 and a second internal refresh signal IREF2 by decoding a refresh command signal REF. The command decoding circuit 1022 may generate the first internal refresh signal IREF1 for refreshing the first memory bank BK1 and the second internal refresh signal IREF2 for refreshing the second memory bank BK2, based on bank address information received together with the refresh command signal REF. Similarly, more memory banks and their respective bank address information may be utilized.

As illustrated in FIG. 10, the active control circuit 1023 may receive the first and second internal active signals IACT1 and IACT2 from the command decoding circuit 1022. The active control circuit 1023 may control active operations of the first and second memory banks BK1 and BK2 based on the first and second internal active signals IACT1 and IACT2. The active control circuit 1023 may activate the first memory bank BK1 based on the first internal active signal IACT1. The active control circuit 1023 may activate the second memory bank BK2 based on the second internal active signal IACT2. More specifically, the active control circuit 1023 may enable specific word lines of the first and second memory banks BK1 and BK2 based on address signals received together with the active command signal ACT. The refresh control circuit 1024 may receive the first and second internal refresh signals IREF1 and IREF2 from the command decoding circuit 1022. The refresh control circuit 1024 may control refresh operations of the first and second memory banks BK1 and BK2 based on the first and second internal refresh signals IREF1 and IREF2. As illustrated in FIG. 10, the refresh control circuit 1024 may activate the first memory bank BK1 based on the first internal refresh signal IREF1, and may perform the refresh operation while sequentially enabling a plurality of word lines of the first memory bank BK1. The refresh control circuit 1024 may activate the second memory bank BK2 based on the second internal refresh signal IREF2, and may perform the refresh operation while sequentially enabling a plurality of word lines of the second memory bank BK2. The refresh control circuit 1024 may include an address counter, and may sequentially change a word line to be enabled, while sequentially increasing a value of an address signal.

The row hammer control circuit 1030 may set a first threshold value RHTH1 for refreshing the first memory bank BK1, by monitoring an active interval of the first memory bank BK1, and may set a second threshold value RHTH2 for refreshing the second memory bank BK2, by monitoring an active interval of the second memory bank BK2e It should be noted that the active interval of the first memory bank BK1 and the active interval of the second memory bank BK2 may be different from each other, and the row hammer control circuit 1030 may set the first threshold value RHTH1 for the first memory bank BK1 and the second threshold value RHTH2 for the second memory bank BK2 independently of each other. The row hammer control circuit 1030 may include a first active monitoring circuit 1031, a second active monitoring circuit 1032 and a mode register circuit 1033. Specifically, the first active monitoring circuit 1031 may receive the first internal active signal IACT1, and may generate a plurality of first selection control signals SEL1<1:3> by monitoring an active interval at which the first memory bank BK1 is accessed based on the first internal active signal IACT1. The second active monitoring circuit 1032 may receive the second internal active signal IACT2, and may generate a plurality of second selection control signals SEL2<1:3> by monitoring an active interval at which the second memory bank BK2 is accessed based on the second internal active signal IACT2. The mode register circuit 1033 may receive the plurality of first selection control signals SEL1<1:3> and the plurality of second selection control signals SEL2<1:3> and may set the first threshold value RHTH1 based on the plurality of first selection control signals SEL1<1:3>. The mode register circuit 1033 may set the second threshold value RHTH2 based on the plurality of second selection control signals SEL2<1:3>. The active monitoring circuit 131 illustrated in FIG. 1 may be applied as each of the first and second active monitoring circuits 1031 and 1032. The mode register circuit 132 illustrated in FIG. 1 may be applied as the mode register circuit 1033. Referring to FIGS. 7 and 10 together, the mode register circuit 1033 may be modified to include two selection circuits, wherein one selection circuit may select the first threshold value RHTH1 based on the plurality of first selection control signals SEL1<1:3>, and the other selection circuit may select the second threshold value RHTH2 based on the plurality of second selection control signals SEL2<1:3>. A register of the mode register circuit 1033 may store both the first threshold value RHTH1 and the second threshold value RHTH2, and may output both the stored first and second threshold values RHTH1 and RHTH2 to the memory controller 110.

As illustrated in FIG. 10, the refresh management circuit 1012 may receive the first and second threshold values RHTH1 and RHTH2 from the memory apparatus 1020 through a data bus 1002. The refresh management circuit 1012 may count the number of times the active command signal ACT for the first memory bank BK1 is generated, and may generate a first refresh management signal RFM1 by comparing an accumulated counting value and the first threshold value RHTH1. When the active command signal ACT for the first memory bank BK1 is generated, the refresh management circuit 1012 may receive a first active counting signal ACTF1 from the command generation circuit 1011, and may generate the accumulated counting value by counting the first active counting signal ACTF1. The refresh management circuit 1012 may count the number of times the active command signal ACT for the second memory bank BK2 is generated, and may generate a second refresh management signal RFM2 by comparing an accumulated counting value and the second threshold value RHTH2. When the active command signal ACT for the second memory bank BK2 is generated, the refresh management circuit 1012 may receive a second active counting signal ACTF2 from the command generation circuit 1011, and may generate the accumulated counting value by counting the second active counting signal ACTF2. When the first refresh management signal RFM1 is enabled, the command generation circuit 1011 may generate the refresh command signal REF for the first memory bank BK1 so that the refresh operation of the first memory bank BK1 may be performed. When the second refresh management signal RFM2 is enabled, the command generation circuit 1011 may generate the refresh command signal REF for the second memory bank BK2 so that the refresh operation of the second memory bank BK2 may be performed.

Figure 11:
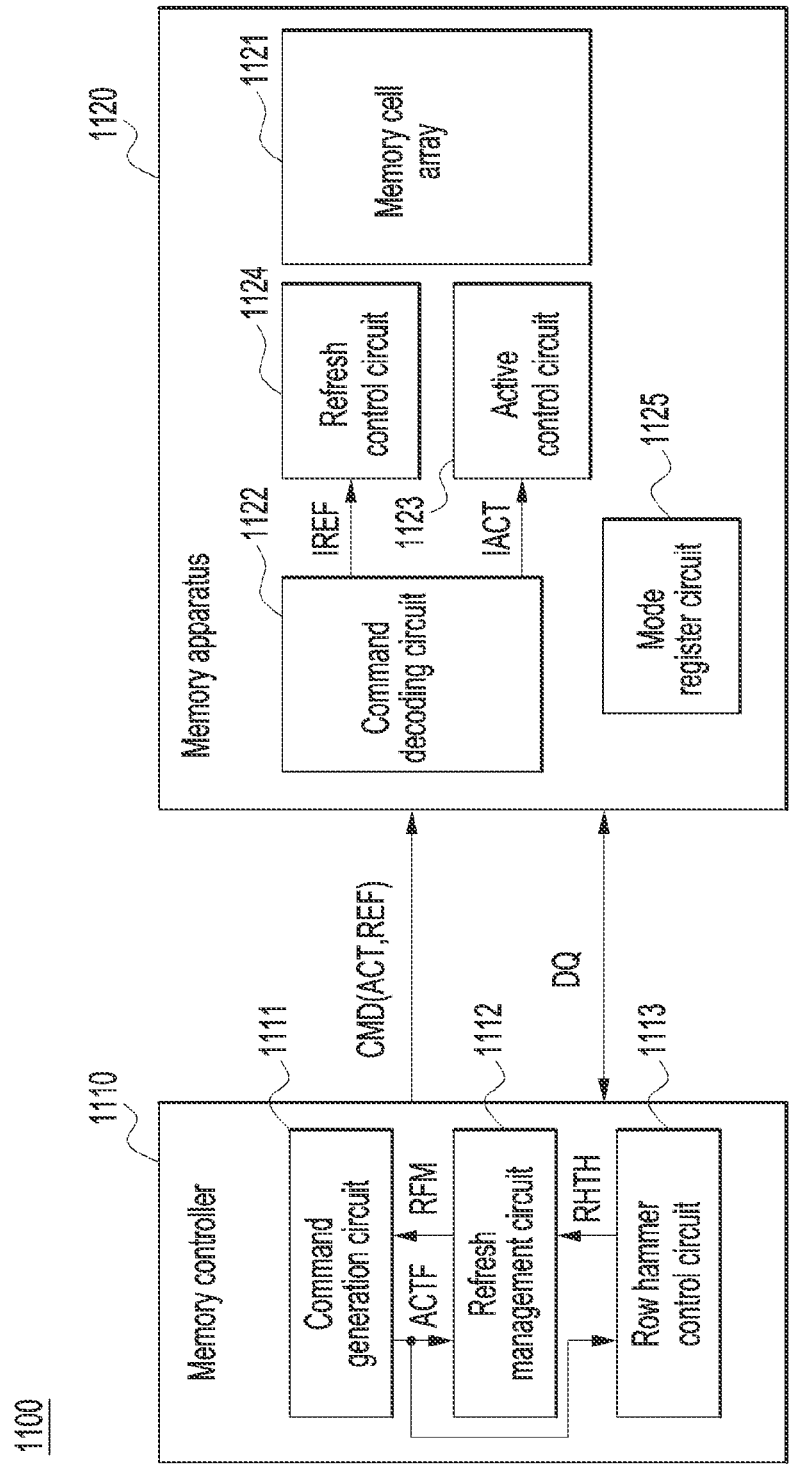
FIG. 11 is a block diagram illustrating an example of the configuration of a semiconductor system in accordance with an embodiment of the disclosure.

FIG. 11 is a diagram illustrating the configuration of a semiconductor system 1100 in accordance with an embodiment of the disclosure. Referring to FIG. 11, the semiconductor system 1100 may include a memory controller 1110 and a memory apparatus 1120. In one embodiment, the semiconductor system 1100 includes the same or similar components as or to those of the semiconductor system 100 illustrated in FIG. 1, and repeated descriptions for the same components will be omitted herein. The memory controller 1110 may generate a refresh command signal REF based on the number of generations of an active command signal ACT for a memory bank of a memory cell array 1121 of the memory apparatus 1120 and a generation interval of the active command signal ACT. Accordingly, the memory apparatus 1120 may perform a refresh operation for the memory bank, based on the refresh command signal REF.

As illustrated in FIG. 11, the memory controller 1110 may include a command generation circuit 1111, a refresh management circuit 1112 and a row hammer control circuit 1113. As illustrated in FIG. 11, the memory apparatus 1120 may include the memory cell array 1121, a command decoding circuit 1122, an active control circuit 1123, a refresh control circuit 1124 and a mode register circuit 1125. In the semiconductor systems 100 and 1000 illustrated in FIGS. 1 and 10, the row hammer control circuits 130 and 1030 are provided in the memory apparatuses 120 and 1020, respectively, whereas, in the semiconductor system 1100 of FIG. 11, the row hammer control circuit 1113 may be provided in the memory controller 1110. To save memory by not storing threshold values, self-monitoring may be utilized. By including the row hammer control circuit 1113, the memory controller 1110 may self-monitor an active interval at which the memory cell array 1121 of the memory apparatus 1120 is accessed. Therefore, the memory controller 1110 may not store a plurality of values in the mode register circuit 1125, and may not receive a threshold value from the mode register circuit 1125. The memory controller 1110 may set a threshold value RHTH by self-monitoring an access interval for the memory cell array 1121 of the memory apparatus 1120. Specifically, the row hammer control circuit 1113 may receive an active counting signal ACTF from the command generation circuit 1111, and may monitor a generation interval of the active command signal ACT for a memory bank of the memory cell array 1121 based on the active counting signal ACTF. The row hammer control circuit 1113 may include the active monitoring circuit 131 illustrated in FIG. 1. The row hammer control circuit 1113 may include a circuit which includes the components illustrated in FIG. 7, in replacement of the mode register circuit 1125. The refresh management circuit 1112 may receive the threshold value RHTH set by the row hammer control circuit 1113, and may receive the active counting signal ACTF from the command generation circuit 1111. The refresh management circuit 1112 may count the number of generations of the active command signal ACT for accessing the memory cell array 1121, based on the active counting signal ACTF. The refresh management circuit 1112 may generate a refresh management signal RFM by comparing an accumulated counting value with the threshold value RHTH. When the refresh management signal RFM is enabled, the command generation circuit 1111 may generate the refresh command signal REF so that a refresh operation for the memory cell array 1121 may be performed.

While various embodiments have been described above, it will be understood to those skilled in the art that the embodiments described are examples only. Accordingly, the memory apparatus mitigating a row hammer and the semiconductor system including the same described herein should not be limited based on the described embodiments.

What is claimed is:

1. A memory apparatus comprising:
    an active monitoring circuit configured to generate a plurality of selection control signals by monitoring an active interval at which a memory bank of a memory cell array is accessed; and
    a mode register circuit configured to set a threshold value for performing a refresh operation, as one of a plurality of values, based on the plurality of selection control signals.

2. The memory apparatus according to claim 1, wherein the refresh operation is performed when the number of times the memory bank is accessed is equal to or greater than the threshold value.

3. The memory apparatus according to claim 1, wherein the active monitoring circuit enables a first selection control signal when the interval at which the memory bank is accessed is shorter than a first time, enables a second selection control signal when the interval at which the memory bank is accessed is longer than the first time and is shorter than a second time, and enables a third selection control signal when the interval at which the memory bank is accessed is longer than the second time.

4. The memory apparatus according to claim 3, wherein the mode register circuit sets the threshold value as a first value based on the first selection control signal, sets the threshold value as a second value greater than the first value based on the second selection control signal, and sets the threshold value as a third value greater than the second value based on the third selection control signal.

5. The memory apparatus according to claim 1, wherein the active monitoring circuit comprises:
    an active period detection circuit configured to generate an active pulse signal having a pulse width corresponding to an interval at which at least two active signals are generated; and
    a pulse width detection circuit configured to enable one of the first selection control signal, the second selection control signal, and the third selection control signal by detecting a pulse width of the active pulse signal.

6. The memory apparatus according to claim 5, wherein the mode register circuit sets a first value as the threshold value based on the first selection control signal, sets a second value, greater than the first value, as the threshold value based on the second selection control signal, and sets a third value, greater than the second value, as the threshold value based on the third selection control signal.

7. A memory apparatus comprising:
    a first memory bank;
    a second memory bank; and
    a row hammer control circuit configured to set a first threshold value as a reference for refreshing the first memory bank, by monitoring an active interval at which the first memory bank is accessed and configured to set a second threshold value as a reference for refreshing the second memory bank, by monitoring an active interval at which the second memory bank is accessed.

8. The memory apparatus according to claim 7, wherein a refresh operation for the first memory bank is performed when the number of times the first memory bank is accessed is equal to or greater than the threshold value, and a refresh operation for the second memory bank is performed when the number of times the second memory bank is accessed is equal to or greater than the threshold value.

9. The memory apparatus according to claim 8, wherein the row hammer control circuit sets the first threshold value to a lower value as an active interval of the first memory bank is shorter, and sets the first threshold value to a higher value as an active interval of the first memory bank is longer.

10. The memory apparatus according to claim 8, wherein the row hammer control circuit sets the second threshold value to a lower value as an active interval of the second memory bank is shorter, and sets the second threshold value to a higher value as an active interval of the second memory bank is longer.

11. The memory apparatus according to claim 8, wherein the row hammer control circuit comprises:
- a first active monitoring circuit configured to generate a plurality of first selection control signals by monitoring an active interval of the first memory bank;
- a second active monitoring circuit configured to generate a plurality of second selection control signals by monitoring an active interval of the second memory bank; and
- a mode register circuit configured to set the first threshold value as one among a plurality of values based on the plurality of first selection control signals and configured to set the second threshold value as one among a plurality of values based on the plurality of second selection control signals.

12. A semiconductor system comprising:
- a memory apparatus configured to monitor an active interval based on an active command signal and configured to change a threshold value based on the active interval; and
- a memory controller configured to access the memory apparatus by generating the active command signal and configured to generate a refresh command signal for refreshing the memory apparatus, based on the number of generations of the active command signal and the threshold value.

13. The semiconductor system according to claim 12, wherein the memory apparatus comprises:
- a row hammer control circuit configured to generate an internal active signal based on the active command signal and configured to set the threshold value by monitoring an interval at which the internal active signal is generated.

14. The semiconductor system according to claim 13, wherein the row hammer control circuit sets the threshold value to a lower value as the monitored interval is shorter, and sets the threshold value to a higher value as the monitored interval is longer.

15. The semiconductor system according to claim 13, wherein the row hammer control circuit comprises:
- an active monitoring circuit configured to generate a plurality of selection control signals by monitoring an interval at which the internal active signal is generated; and
- a mode register circuit configured to set the threshold value as one of a plurality of values, based on the plurality of selection control signals.

16. The semiconductor system according to claim 15, wherein the memory controller comprises:
- a refresh management circuit configured to compare an accumulated counting value, generated by counting the number of generations of the active command signal, with the threshold value, and configured to generate a refresh management signal when the accumulated counting value is equal to or greater than the threshold value; and
- a command generation circuit configured to generate the active command signal and configured to generate the refresh command signal based on the refresh management signal.

17. The semiconductor system according to claim 16, wherein the refresh management circuit subtracts the threshold value from the accumulated counting value when the refresh command signal is generated.

18. A semiconductor system comprising:
- a memory apparatus including a memory bank; and
- a memory controller configured to generate a refresh command signal based on the number of generations of an active command signal for the memory bank and an active interval of the active command signal,
wherein the memory apparatus performs a refresh operation for the memory bank, based on the refresh command signal.

19. The semiconductor system according to claim 18, wherein the memory controller sets a threshold value based on the active interval and generates the refresh command signal when an accumulated counting value generated by counting the number of generations of the active command signal is equal to or greater than the threshold value.

20. The semiconductor system according to claim 19, wherein the memory controller sets the threshold value to a smaller value as the active interval is shorter, and sets the threshold value to a larger value as the active interval is longer.

21. The semiconductor system according to claim 19, wherein the memory controller comprises:
- a row hammer control circuit configured to set the threshold value by monitoring the active interval;
- a refresh management circuit configured to generate a refresh management signal by comparing the accumulated counting value and the threshold value; and
- a command generation circuit configured to generate the active command signal, and generate the refresh command signal based on the refresh management signal.

* * * * *